United States Patent
Katta et al.

(10) Patent No.: US 12,095,458 B2
(45) Date of Patent: Sep. 17, 2024

(54) SYSTEMS AND METHODS FOR QUARTER RATE SERIALIZATION

(71) Applicant: Samsung Electronics Co., Ltd., Suwon-si (KR)

(72) Inventors: Umamaheswara Reddy Katta, Bengaluru (IN); Tamal Das, Bengaluru (IN)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 76 days.

(21) Appl. No.: 17/825,378

(22) Filed: May 26, 2022

(65) Prior Publication Data

US 2023/0208423 A1 Jun. 29, 2023

(30) Foreign Application Priority Data

Dec. 24, 2021 (IN) .............................. 202141060699

(51) Int. Cl.
| | | |
|---|---|---|
| *H03K 19/0185* | (2006.01) | |
| *H03K 19/017* | (2006.01) | |
| *H03K 19/094* | (2006.01) | |
| *H03K 19/20* | (2006.01) | |

(52) U.S. Cl.
CPC . *H03K 19/01855* (2013.01); *H03K 19/01742* (2013.01); *H03K 19/0941* (2013.01); *H03K 19/20* (2013.01)

(58) Field of Classification Search
CPC ....... H03K 19/01855; H03K 19/01742; H03K 19/0941; H03K 19/20
See application file for complete search history.

(56) References Cited

U.S. PATENT DOCUMENTS

| | | | |
|---|---|---|---|
| 7,924,963 B2 * | 4/2011 | Dally .................... | H04J 3/0685 |
| | | | 375/327 |
| 10,560,097 B1 * | 2/2020 | Peng ....................... | H04L 7/033 |
| 11,228,416 B1 * | 1/2022 | Huss ........................ | G06F 1/12 |
| 2009/0259781 A1 | 10/2009 | Padaparambil | |
| 2015/0123826 A1 * | 5/2015 | Lee ......................... | H03M 9/00 |
| | | | 341/101 |

(Continued)

OTHER PUBLICATIONS

A. Roshan-Zamir et al. 'A Reconfigurable 16/32 Gb/s Dual-Mode NRZ/PAM4 SerDes in 65-nm CMOS' *IEEE*, Jun. 13, 2017, pp. 2430-2447.

*Primary Examiner* — Kurtis R Bahr
(74) *Attorney, Agent, or Firm* — HARNESS, DICKEY & PIERCE, P.L.C.

(57) ABSTRACT

A method, implemented in a serializer for quarter rate serialization, is disclosed. The method includes receiving a plurality of in-phase and quarter-phase clock signals defining a quarter phase clock. The method includes receiving a quarter rate data input and sequentially outputting data in accordance with the quarter phase clock. The method includes receiving at least one data input from amongst the quarter rate input and outputting a first logical output in accordance with the in-phase clock signal and the quarter-phase clock signal. The method includes receiving said at least one data input and outputting a second logical output in accordance a complementary in-phase clock signal and a complementary quarter-phase clock signal. The method includes outputting, an output associated with the branch.

20 Claims, 12 Drawing Sheets

(56) References Cited

U.S. PATENT DOCUMENTS

| | | | |
|---|---|---|---|
| 2016/0006596 A1* | 1/2016 | Dickson | H04L 27/364 375/298 |
| 2018/0343016 A1* | 11/2018 | Dietrich | G06F 13/385 |
| 2020/0084074 A1* | 3/2020 | Toprak-Deniz | H04L 27/0002 |

* cited by examiner

FIG. 6B     600b
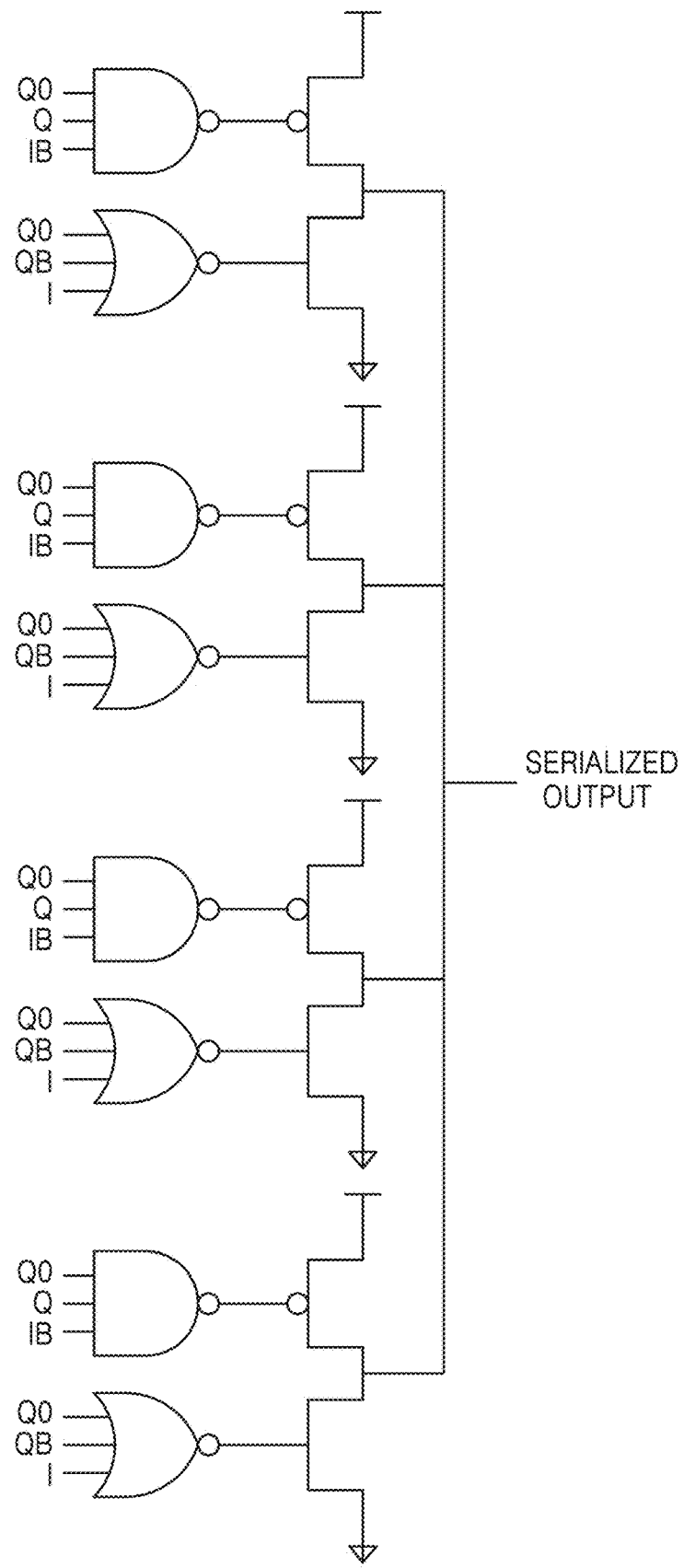
SERIALIZED OUTPUT

SYSTEMS AND METHODS FOR QUARTER RATE SERIALIZATION

CROSS-REFERENCE TO RELATED APPLICATION

This U.S. nonprovisional application claims priority under 35 U.S.C § 119 to Indian Patent Application No. 202141060699 filed on Dec. 24, 2021 in the Indian Intellectual Property Office, the disclosure of which is hereby incorporated by reference in its entirety.

BACKGROUND

Some example embodiments relate to a quarter rate serializer. Some example embodiments relate to systems and methods for high-speed power efficient quarter rate serializer Traditionally, as a serializer-deserializer (SerDes) link speed increases, a quarter rate serializer is more efficient than a half rate serializer in terms of power. But a quarter rate serialization is not straight forward to implement, and/or cursor generation and/or achieving lower data dependent jitter (DDJ) are challenging.

FIG. 1 illustrates a circuit diagram 100 depicting a 4 to 1 implementation of a serializer, in accordance with an existing technique. In such a technique, the 4 to 1 implementation may be based on 1 universal input (UI) pulse generation. Furthermore, the 1 UI pulse generation may include a speed limitation as timing is to be closed in a 1 UI domain. The serializer may be an A 112 Gb/s pulse amplitude modulation (PAM-4) 56 Gb/s non-return-to-zero (NRZ) reconfigurable transmitter with three-tap feed-forward equalization (FFE) in 10-nm FinFET technology. Each of inputs d0, d1, d2, d3, each amplifier SST, each transistor M1-M8, clock signals CK0 and CK90, and voltage nodes X and Y are illustrated in FIG. 1.

FIG. 2A illustrates a circuit diagram 200a depicting a 4 to 1 implementation including six stages between a clock and an output, in accordance with an existing technique. The six stages between the clock, while the output may result in a data dependent jitter (DDJ).

FIG. 2B illustrates a timing diagram 200b depicting the 4 to 1 implementation of a reconfigurable 16/32 Gb/s dual-mode NRZ/PAM4 SerDes in 65-nm CMOS technology, in accordance with an existing technique.

Thus, there is a need or desire for a solution that overcomes the above deficiencies.

SUMMARY

This summary is provided to introduce a selection of some example concepts, in a simplified format, that are further described in the detailed description of various example embodiments. This summary is neither intended to identify key nor essential inventive concepts nor is it intended for determining the scope of inventive concepts.

In accordance with some example embodiments of inventive concepts, a serializer based on quarter rate architecture for a transmitter is disclosed. The serializer a port configured to receive a quarter rate data input, a quarter-phase clock generator configured to generate an in-phase clock signal, a complimentary in-phase clock signal, and quarter-phase clock signal, and a complimentary quarter-phase clock signal, and a plurality of branches configured to receive the quarter rate data input, and to sequentially output data based on a clock signal generated by the quarter-phase clock generator. Each of the plurality of branches includes a first logical gate configured to receive at least one data input among the quarter rate input and to output a first logical output based on (A) one of the in-phase clock signal or the complementary in-phase clock signal and on (B) one of the quarter-phase clock signal or the complementary quarter-phase clock signal, a second logical gate configured to receive the at least one data input and to output a second logical output based on (C) the other of the in-phase clock signal or the complementary in-phase clock signal and on (D) the other of the quarter-phase clock signal or the complementary quarter-phase clock signal, and driver circuitry connected to an output of the first logical gate and an output of the second logical gate, the driver circuitry configured to output a final logical output, the final logical output associated with the each branch of the plurality of branches.

According to some example embodiments, a method, implemented in a serializer for quarter rate serialization receiving a plurality of clock signals including an in-phase clock signal, a complimentary in-phase clock signal, a quarter-phase clock signal and a complimentary quarter-phase clock signals, the plurality of clock signals defining a quarter-phase clock, receiving, at one of a plurality of branches, a quarter rate data input, sequentially outputting data in accordance with the plurality of clock signals, receiving, by a first logical gate in each branch of the plurality of branches, at least one data input amongst the quarter rate input, outputting a first logical output based on (A) one of the in-phase clock signal or the complementary in-phase clock signal and on (B) one of the quarter-phase clock signal or the complementary quarter-phase clock signal, receiving, by a second gate in each branch, the at least one data input, outputting a second logical output based on (C) the other of the in-phase clock signal or the complementary in-phase clock signal and on (D) the other of the quarter-phase clock signal or the complementary quarter-phase clock signal, and outputting, by driver circuitry connected at an output of the first logical gate and the second logical gate a final logical output associated with the one of the plurality of branches.

To further clarify some advantages and/or some features of example embodiments, a more particular description of the invention will be rendered by reference to some example embodiments thereof, which is illustrated in the appended drawings. It is appreciated that these drawings depict only some example embodiments and are therefore not to be considered limiting of its scope. Some example embodiments will be described and explained with additional specificity and detail with the accompanying drawings.

BRIEF DESCRIPTION OF THE DRAWINGS

These and other features, aspects, and/or advantages of some example embodiments will become better understood when the following detailed description is read with reference to the accompanying drawings in which like characters represent like parts throughout the drawings, wherein:

FIG. 6B illustrate an exploded of the 4-to-1 quarter rate serializer, in accordance with some example embodiments of inventive concepts;

Figure 1:
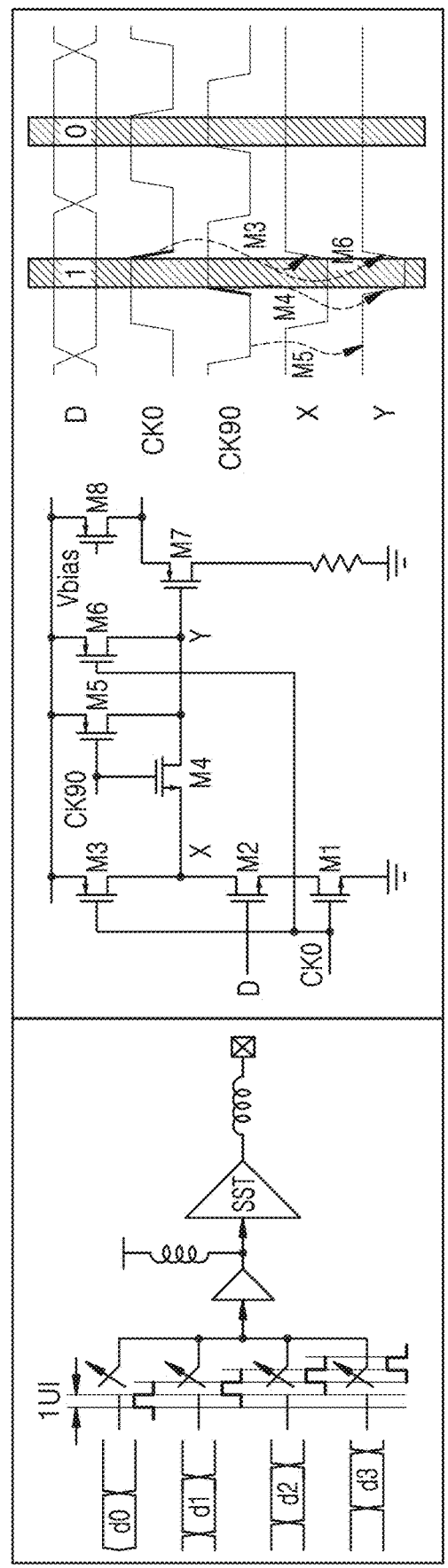
FIG. 1 illustrates a circuit diagram depicting a 4 to 1 implementation of a serializer.
Figure 2A:
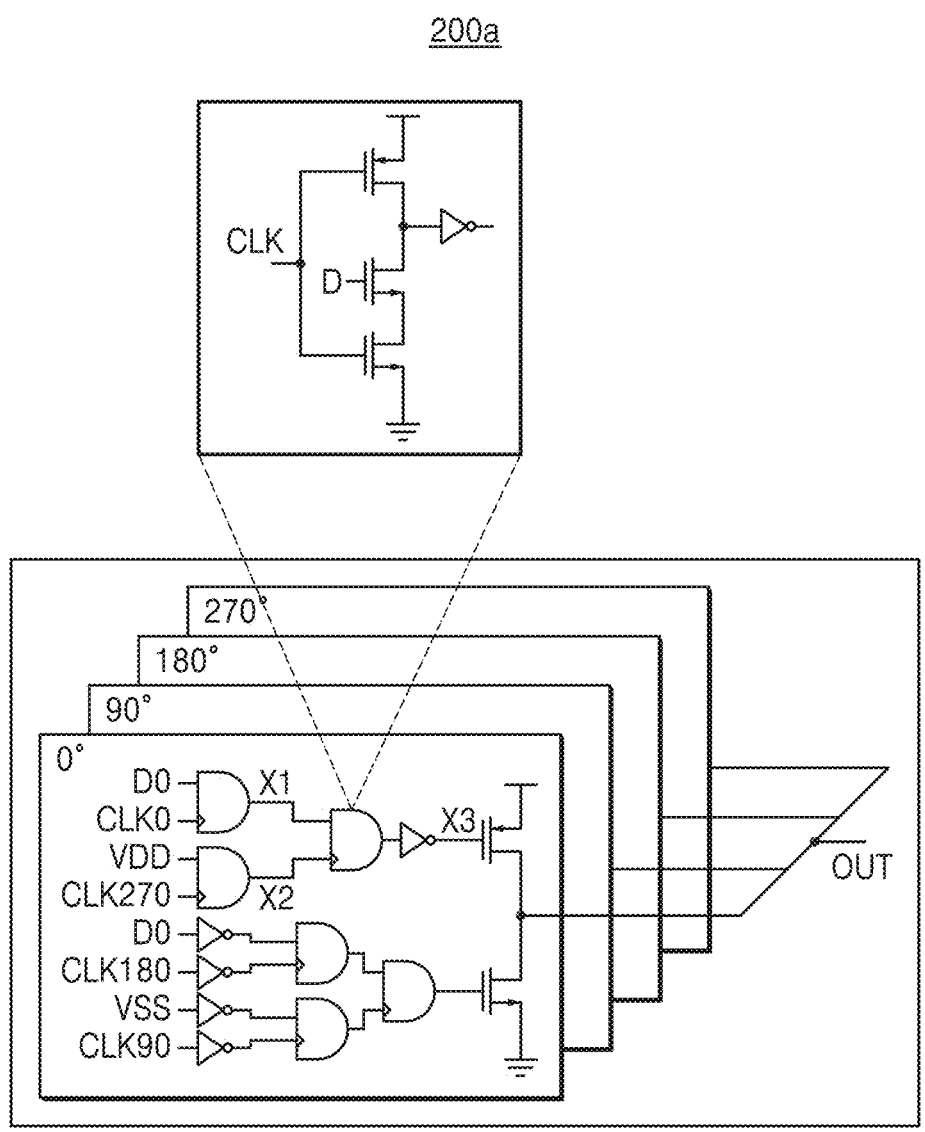
FIG. 2A illustrates a circuit diagram depicting a 4 to 1 implementation including six stages between a clock and an output.
Figure 2B:
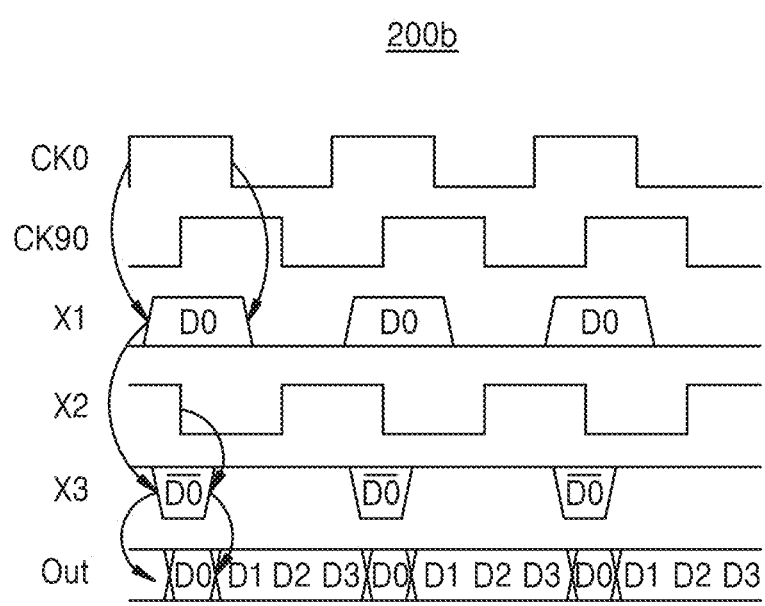
FIG. 2B illustrates a circuit diagram depicting the 4 to 1 implementation of a reconfigurable 16/32 Gb/s dual-mode NRZ/PAM4 SerDes in 65-nm CMOS.

Persons of ordinary skill in the art may appreciate that elements in the drawings are illustrated for simplicity and may not have been necessarily been drawn to scale. For example, the flow charts may illustrate the method in terms of steps involved to help to improve understanding of aspects of inventive concepts. Furthermore, in terms of the construction of the device, one or more components of the device may have been represented in the drawings by conventional symbols, and the drawings may show only those specific details that are pertinent to understanding the embodiments of the present invention so as not to obscure the drawings with details that will be readily apparent to those of ordinary skill in the art having benefit of the description herein.

DETAILED DESCRIPTION OF SOME EXAMPLE EMBODIMENTS

For promoting an understanding of the principles of the invention, reference will now be made to some example embodiments illustrated in the drawings and specific language will be used to describe the same. It will nevertheless be understood that no limitation of the scope of the invention is thereby intended, such alterations and further modifications in the illustrated system, and such further applications of the principles of some example embodiments as illustrated therein being contemplated as would normally occur to one of ordinary skill in the art to which the invention relates.

It will be understood by those of ordinary skill in the art that the foregoing general description and the following detailed description are explanatory of the invention and are not intended to be restrictive thereof.

Reference throughout this specification to "an aspect", "another aspect" or similar language means that a particular feature, structure, and/or characteristic described in connection with the embodiment is included in at least one example embodiment of inventive concepts. Thus, appearances of the phrase "in an embodiment", "in another embodiment" and similar language throughout this specification may, but do not necessarily, all refer to the same embodiment.

The terms "comprises", "comprising", "containing", "having", "including", or any other variations thereof, are intended to cover a non-exclusive inclusion, such that a process and/or method that comprises a list of steps does not include only those steps but may include other steps not expressly listed or inherent to such process or method. Similarly, one or more devices or sub-systems or elements or structures or components proceeded by "comprises a" does not necessarily, without more constraints, preclude the existence of other devices and/or other sub-systems or other elements or other structures or other components or additional devices or additional sub-systems and/or additional elements and/or additional structures or additional components.

Unless otherwise defined, all technical and scientific terms used herein have the same meaning as commonly understood by one of ordinary skill in the art to which inventive concepts belong. The system, methods, and examples provided herein are illustrative only and not intended to be limiting.

Figure 3:
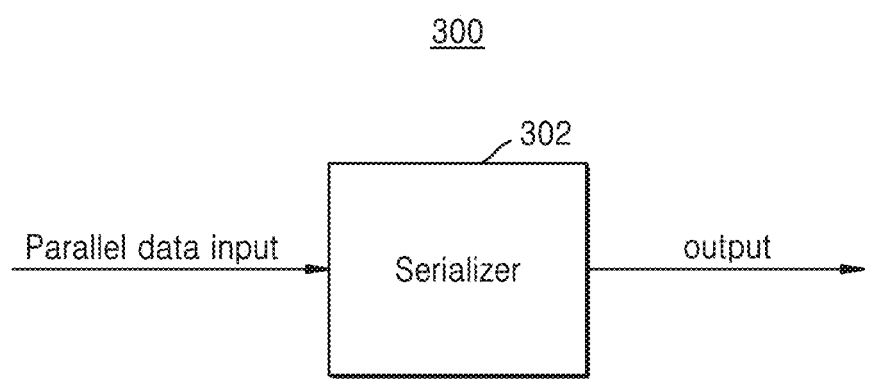
FIG. 3 illustrates an environment including a serializer for quarter rate serialization, in accordance with some example embodiments of inventive concepts.

FIG. 3 illustrates an environment 300 including a quarter rate serializer 302 for quarter rate serialization, in accordance with some example embodiments of inventive concepts. In some example embodiments, the quarter rate serializer 302 may be based on a quarter rate architecture for a transmitter. The quarter rate serializer 302 may be configured to utilize a number of input NAND-NOR gates, and the number of input NAND-NOR gates may provide a connection such that a number of internal nodes are charged and discharged to definite voltage in a manner to reduce a data dependent jitter. In some example embodiments, the quarter rate serializer 302 may be based on a plurality of in-phase and quarter-phase clock signals.

According to some example embodiments, the quarter rate serializer 302 may be configured to receive a quarter rate data input. In some example embodiments, upon receiving the quarter rate data input, the quarter rate serializer 302 may be configured to sequentially output data in accordance with a quarter phase clock.

In some example embodiments, the quarter rate serializer 302 may be configured to output a first logical output in accordance with an in-phase clock signal and in accordance with the quarter-phase clock signal, from at least one data input amongst the quarter rate data input. Continuing with some example embodiments, the quarter rate serializer 302 may be configured to output a second logical output in accordance with a complementary in-phase clock signal and a complementary quarter-phase clock signal, from at least one data input amongst the quarter rate data input. In continuation with some example embodiments, the quarter rate serializer 302 may be configured to output a final logical output associated with a branch, e.g. a logical branch and/or a physical branch of logic gates taken in the output of the final logical output.

Figure 4:
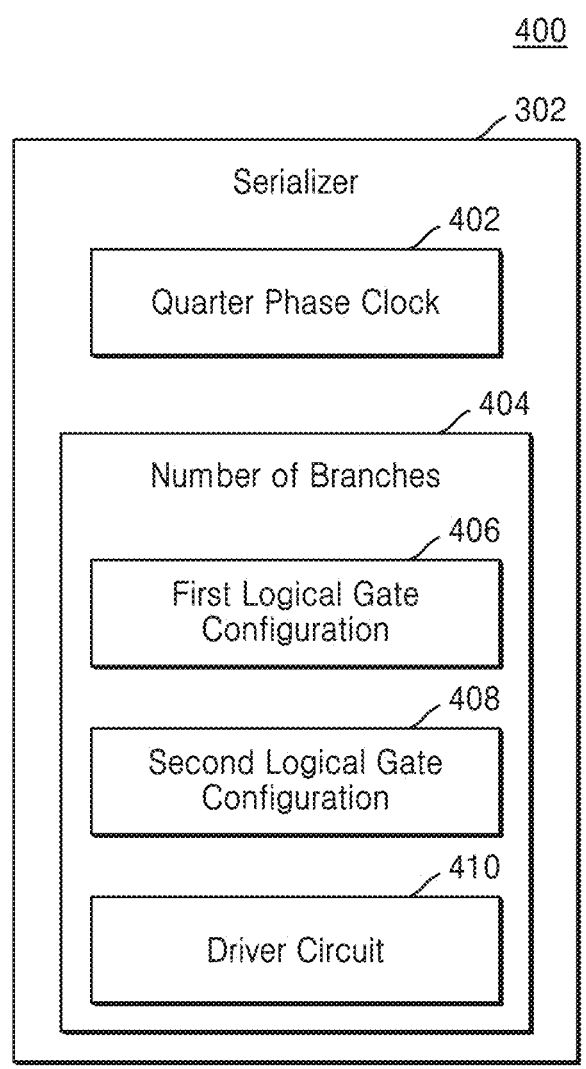
FIG. 4 illustrates a schematic block diagram of the serializer for quarter rate serialization, in accordance with some example embodiments of inventive concepts.

FIG. 4 illustrates a schematic block diagram 400 of the quarter rate serializer 302 for quarter rate serialization, in accordance with some example embodiments of inventive concepts. In some example embodiments, the quarter rate serializer 302 may be or may include or correspond to a serializer based on a quarter rate architecture. In some example embodiments, the quarter rate serializer 302 may be based on a plurality of in-phase and quarter-phase clock signals. In some example embodiments, the quarter rate serializer 302 may be configured to receive a quarter rate data input. In some example embodiments, the quarter rate data input may be based on at least one of a main data input, a precursor data input, and a post cursor data input. In some example embodiments, a main data input may correspond to a second latch output of a final stage flop of a previous serializer stage within the quarter rate serializer 302. Furthermore, a precursor data input may correspond to a first latch output of the final stage flop of the previous serializer stage within the quarter rate serializer 302. Continuing with some example embodiments, a postcursor data input may correspond to a delayed output of the final stage flop of the previous serializer stage within the quarter rate serializer 302.

In some example embodiments, the quarter rate serializer 302 may include a quarter phase clock generator 402 that generates a quarter phase clock defined by a plurality of in-phase and quarter-phase clock signals.

In some example embodiments, the quarter rate serializer 302 may include a number of branches 404 or ports and/or electrical paths and/or wires connecting gates for receiving the quarter rate data input. In some example embodiments, the number of branches may be further configured to sequentially output data in accordance with the quarter phase clock. Continuing with some example embodiments, the number of branches 404 may include a first logical gate configuration 406, a second logical gate configuration 408, and driver circuitry such as a driver circuit 410.

In some example embodiments, the first logical gate configuration 406 may be configured to receive at least one data input from amongst the quarter rate data input. Furthermore, upon receiving the at least one data input, the first logical gate configuration 406 may be configured to output a first logical output in accordance with the in-phase clock signal and with the quarter-phase clock signal.

In continuation with some example embodiments, the second logical gate configuration 408 may be configured to receive the at least one data input. Furthermore, the second logical gate configuration may be configured to output a second logical output in accordance a complementary in-phase clock signal and a complementary quarter-phase clock signal, e.g. signals that are out-of-phase with the in-phase clock signal and the quarter-phase clock signal.

In some example embodiments, the first logical gate configuration 406 and the second logical gate configuration 408 may correspond to NAND and NOR gate configurations, respectively. Furthermore, in some example embodiments, the first logical gate configuration 406 and the second logical gate configuration 410 may be composed of PMOS and NMOS switches or transistors. For example, each of the first logical gate configuration 406 and the second logical gate configuration 410 may include a plurality of NMOS transistors and a plurality of PMOS transistors that are arranged in series and/or arranged in parallel. Furthermore, the first logical gate configuration 406 may be connected to at least one PMOS transistor, and the second logical gate configuration 410 may be connected to at least one NMOS transistor. The at least one PMOS transistor and the at least one NMOS transistor may be connected, e.g., connected in series with one another, and may correspond to a CMOS inverter.

Continuing with some example embodiments, the driver circuit 410 may be connected at the output of the first and second logical gate to output a final logical output associated with each branch. In some example embodiments, the driver circuit 410 may correspond to a CMOS inverter-based push-pull configuration to generate a rail voltage, e.g. a Vdd voltage as the final output.

Figure 5:
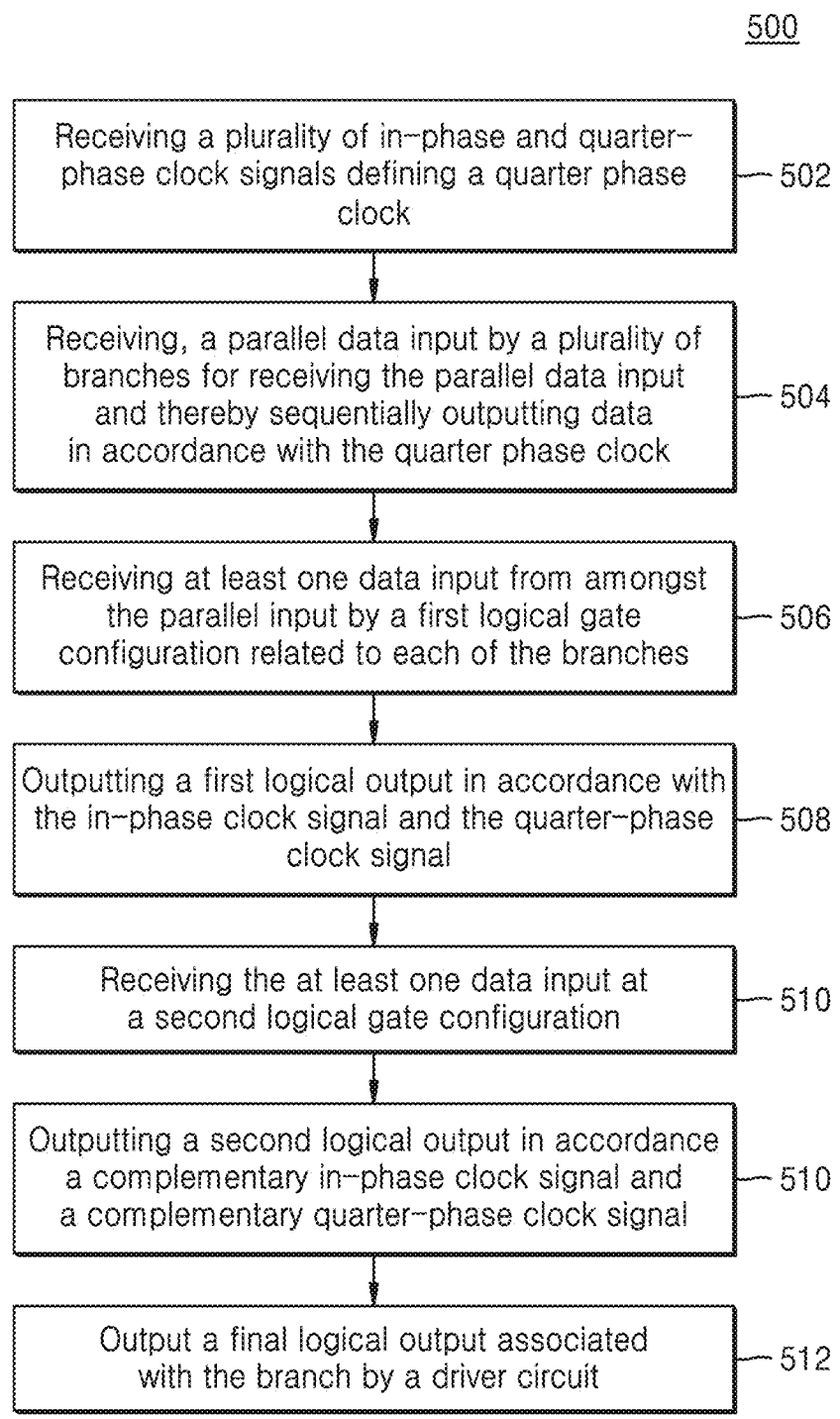
FIG. 5 illustrates an operational flow diagram depicting a process for quarter rate serialization, in accordance with some example embodiments of inventive concepts.

FIG. 5 illustrates an operational flow diagram 500 depicting a process for a quarter rate serialization, in accordance with embodiment some example embodiments of inventive concepts. In some example embodiments, the quarter rate serialization may be performed by the quarter rate serializer 302 as referred in the FIG. 3. In some example embodiments, the process may be based on quarter rate architecture for a transmitter.

Continuing with some example embodiments, the process may include receiving (step 502) a quarter rate data input. In some example embodiments, the quarter rate data input may be received to output data in accordance with the quarter phase clock 402 as referred in the FIG. 4. In some example embodiments, the quarter rate data input may be received by the number of branches 404 as referred in FIG. 4. In some example embodiments, the quarter rate data input may be based on at least one of a main data input, a precursor data input, and a post cursor data input.

In some example embodiments, the main data input may correspond to a second latch output of final stage flop of a previous serializer stage within the quarter rate serializer 302. Furthermore, the precursor data input may correspond to a first latch output of the final stage flop of the previous serializer stage within the quarter rate serializer 302. Continuing with some example embodiments, the postcursor data input may correspond to a delayed output of the final stage flop of the previous serializer stage within the quarter rate serializer 302.

Continuing with some example embodiments, the process may proceed towards receiving (step 504) at least one data input amongst the quarter rate data input. In some example embodiments, the at least one data input may be received the first logical gate configuration 406.

In some example embodiments the process may include outputting (step 506) a first logical output in accordance with the in-phase clock signal and with the quarter-phase clock signal. In some example embodiments, the first logical output may be output by the first logical gate configuration 406.

In continuation with some example embodiments, the process may proceed towards receiving (step 508) the at least one data input. In some example embodiments, the at least one data input may be received by the second logical gate configuration 408.

Moving forward, the process may include outputting (step 510) a second logical output in accordance a complementary in-phase clock signal and a complementary quarter-phase clock signal. In some example embodiments, the second logical output may be output by the second logical gate configuration 408. In some example embodiments, the first logical gate configuration 406 and the second logical gate configuration 408 may correspond to NAND and NOR gate configurations, e.g. respectively NAND gates and NOR gates. Furthermore, in some example embodiments, the first logical gate configuration 406 and the second logical gate configuration 410 may be composed of PMOS and NMOS switches, e.g. a plurality of PMOS transistors and a plurality of NMOS transistors. For example, an output of a NAND gate may be connected to an input of at least one PMOS transistor, and an output of a NOR gate may be connected to an input of at least one NMOS transistor. The at least one PMOS transistor may be connected in series with the at least one NMOS transistor. The at least one PMOS transistor and the at least one NMOS transistor may correspond to a CMOS invert.

In some example embodiments, the process may proceed towards outputting (step 512) final logical output associated with each branch by the driver circuit 410 as referred in the FIG. 4. In some example embodiments, the driver circuit 410 may be connected at the output of the first and second logical gate to output a final logical output associated with each branch.

In some example embodiments, the data input, and the in-phase clock signal, the quarter-phase clock signal may be inputted to the NAND gate in a predetermined order to obtain a serialized output with minimal jitter. Furthermore, in some example embodiments, the data input, the in-phase clock signal and quarter-phase clock signal may be inputted to the NOR gate in a variably determined, or, alternatively, predetermined order to obtain a serialized output with minimal jitter. For example, the order may be determined based on a jitter of the output of the serializer 302.

Figure 6A:
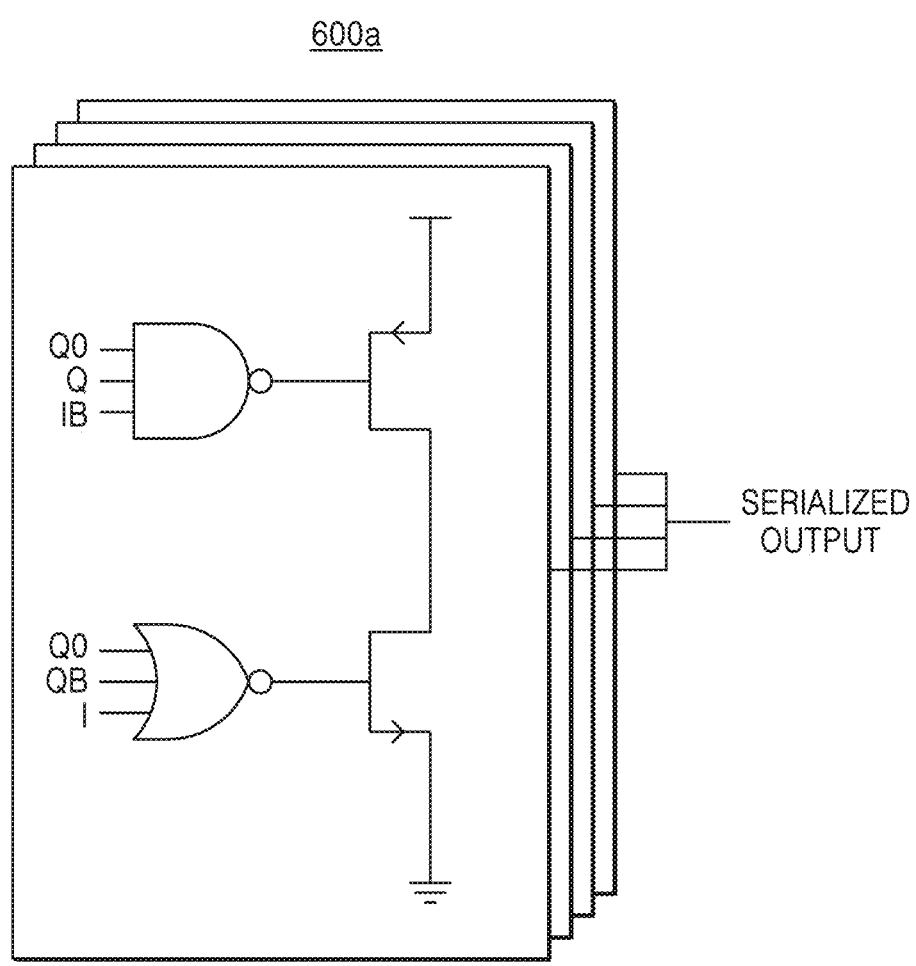
FIG. 6A illustrates a circuit diagram depicting a 4-to-1 quarter rate serializer, in accordance with some example embodiments of inventive concepts.

FIG. 6A illustrates a circuit diagram 600a depicting a 4 to 1 of quarter rate serializer, in accordance with some example embodiments of inventive concepts. In some example embodiments, the 4 to 1 serializer may be or may include the quarter rate serializer 302 as referred in the FIG. 3. Moving forward, the 4 to 1 serializer may include a number of, e.g. four, slices. In some example embodiments, the number of slices may be referred as q0, q1, q2, and q3. In some example embodiments, each slice may include at least one NAND gate and at least one NOR gate.

FIG. 6B illustrates an exploded view 600b of the 4 to 1 serializer, in accordance with some example embodiments of inventive concepts. In some example embodiments, a table 1 and a table 2 represents truth tables associated with the NAND gate and the NOR gate of the slice q0.

TABLE 1

| Q0 | Q | IB | NAND Output |
|----|---|----|-------------|
| 0  | 0 | 0  | 1 |
| 0  | 0 | 1  | 1 |
| 0  | 1 | 0  | 1 |
| 0  | 1 | 1  | 1 |
| 1  | 0 | 0  | 1 |
| 1  | 0 | 1  | 1 |
| 1  | 1 | 0  | 1 |
| 1  | 1 | 1  | 0 |

TABLE 2

| Q0 | QB | I | NOR Output |
|----|----|---|------------|
| 0  | 0  | 0 | 1 |
| 0  | 0  | 1 | 0 |
| 0  | 1  | 0 | 0 |
| 0  | 1  | 1 | 0 |
| 1  | 0  | 0 | 0 |
| 1  | 0  | 1 | 0 |
| 1  | 1  | 0 | 0 |
| 1  | 1  | 1 | 0 |

Furthermore, a table 3 and a table 4 represents truth tables associated with the NAND gate and the NOR gate of the slice q1.

TABLE 3

| Q1 | IB | QB | NAND Output |
|----|----|----|-------------|
| 0  | 0  | 0  | 1 |
| 0  | 0  | 1  | 1 |
| 0  | 1  | 0  | 1 |
| 0  | 1  | 1  | 1 |
| 1  | 0  | 0  | 1 |
| 1  | 0  | 1  | 1 |
| 1  | 1  | 0  | 1 |
| 1  | 1  | 1  | 0 |

TABLE 4

| Q1 | I | Q | NOR |
|----|---|---|-----|
| 0  | 0 | 0 | 1 |
| 0  | 0 | 1 | 0 |
| 0  | 1 | 0 | 0 |
| 0  | 1 | 1 | 0 |
| 1  | 0 | 0 | 0 |
| 1  | 0 | 1 | 0 |
| 1  | 1 | 0 | 0 |
| 1  | 1 | 1 | 0 |

Furthermore, a table 5 and a table 6 represents truth tables associated with the NAND gate and the NOR gate of the slice q2.

TABLE 5

| Q2 | QB | I | NAND Output |
|----|----|---|-------------|
| 0  | 0  | 0 | 1 |
| 0  | 0  | 1 | 1 |
| 0  | 1  | 0 | 1 |
| 0  | 1  | 1 | 1 |
| 1  | 0  | 0 | 1 |
| 1  | 0  | 1 | 1 |
| 1  | 1  | 0 | 1 |
| 1  | 1  | 1 | 0 |

TABLE 6

| Q2 | Q | IB | NOR |
|----|---|----|-----|
| 0  | 0 | 0  | 1 |
| 0  | 0 | 1  | 0 |
| 0  | 1 | 0  | 0 |
| 0  | 1 | 1  | 0 |
| 1  | 0 | 0  | 0 |
| 1  | 0 | 1  | 0 |
| 1  | 1 | 0  | 0 |
| 1  | 1 | 1  | 0 |

Furthermore, a table 7 and a table 8 represents truth tables associated with the NAND gate and the NOR gate of the slice q3.

TABLE 7

| Q3 | I | Q | NAND Output |
|----|---|---|-------------|
| 0  | 0 | 0 | 1 |
| 0  | 0 | 1 | 1 |
| 0  | 1 | 0 | 1 |
| 0  | 1 | 1 | 1 |
| 1  | 0 | 0 | 1 |
| 1  | 0 | 1 | 1 |
| 1  | 1 | 0 | 1 |
| 1  | 1 | 1 | 0 |

TABLE 8

| Q3 | IB | QB | NOR |
|---|---|---|---|
| 0 | 0 | 0 | 1 |
| 0 | 0 | 1 | 0 |
| 0 | 1 | 0 | 0 |
| 0 | 1 | 1 | 0 |
| 1 | 0 | 0 | 0 |
| 1 | 0 | 1 | 0 |
| 1 | 1 | 0 | 0 |
| 1 | 1 | 1 | 0 |

Figure 6C:
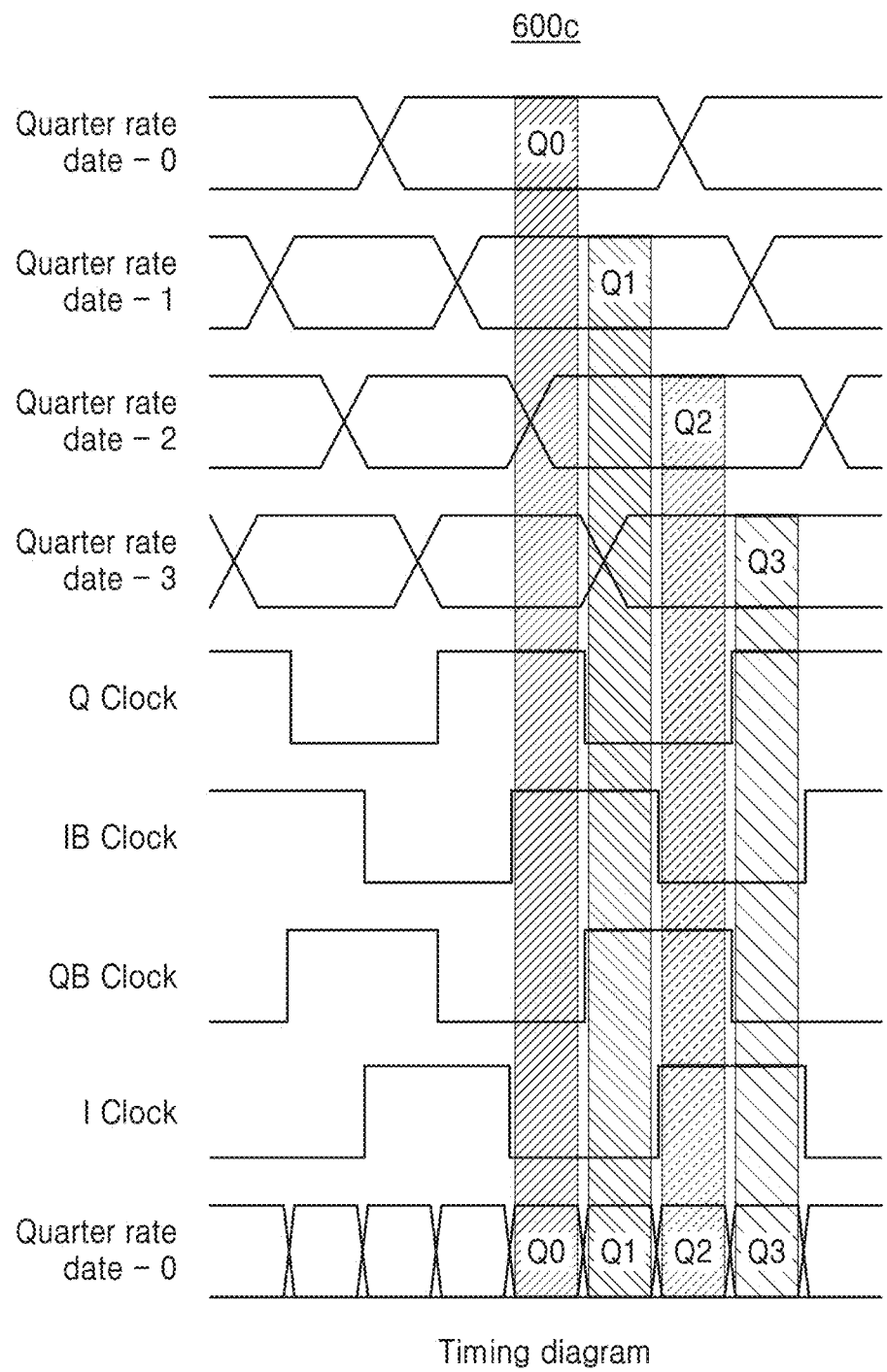
FIG. 6C illustrates a timing diagram related to the 4 to 1 quarter rate serializer, in accordance with some example embodiments of inventive concepts.

FIG. 6C illustrates a timing diagram 600c related to the 4 to 1 serializer, in accordance with some example embodiments of inventive concepts. In some example embodiments, the timing diagram 600c may include a Q clock corresponding to a quarter-phase clock signal, an IB clock corresponding to a complementary in-phase clock signal, a QB clock corresponding to a complementary quarter-phase clock signal, and an I clock corresponding to an in-phase clock signal.

Figure 7A:
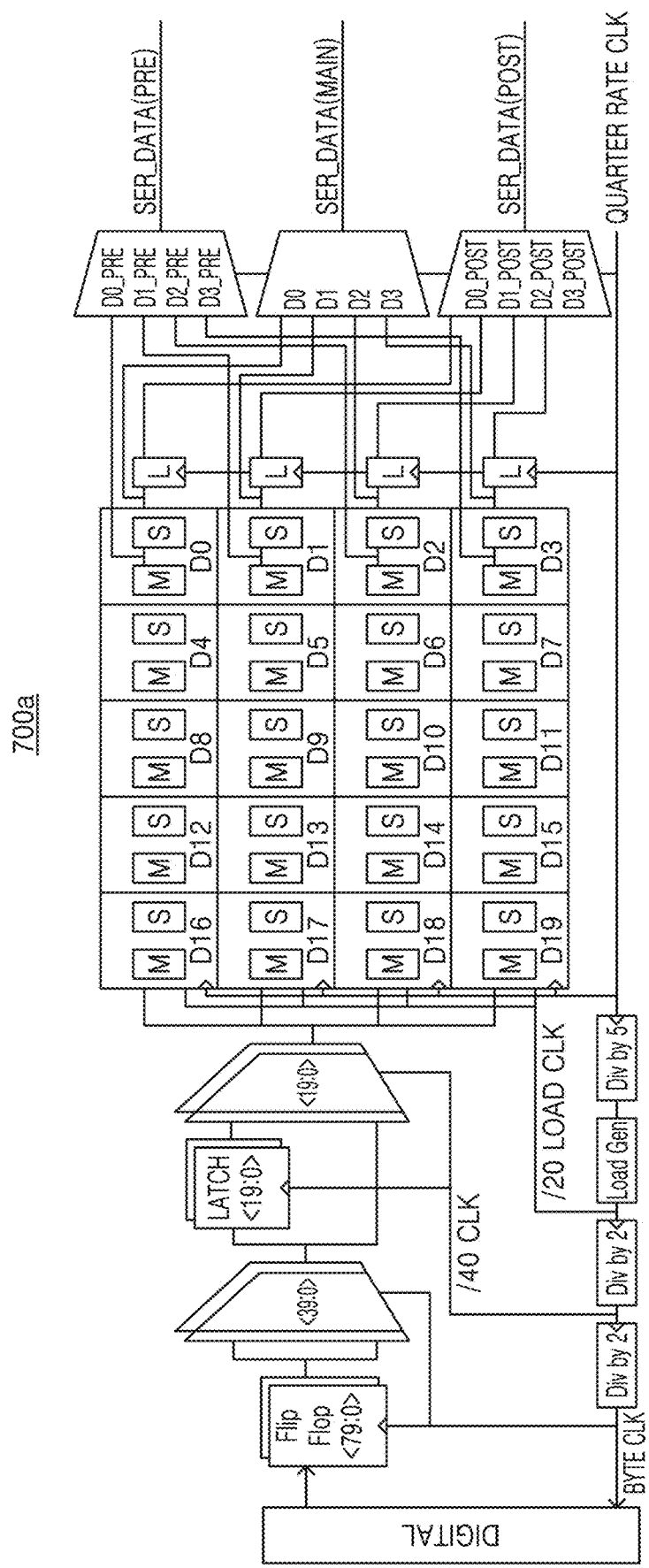
FIG. 7A illustrates an 80-bit quarter rate serializer with cursor generation, in accordance with some example embodiments of inventive concepts.

FIG. 7A illustrates a circuit diagram 700a depicting an 80-bit serializer, in accordance with some example embodiments of inventive concepts. In some example embodiments, the 80-bit serializer may be referred as a full serializer. In some example embodiments, the full serializer may be operating based on the 4 to 1 serializer. In some example embodiments, working of the full serializer may be based on a number of 4 to 1 serializers operating with one another. In some example embodiments, the three 4 to 1 serializers may be the quarter rate serializer 302 as referred in the FIG. 3. In some example embodiments, three 4 to 1 serializers may be operating with one another.

In some example embodiments, the full serializer may be configured to receive parallel data input. Further, the full serializer may be configured to receive a half rate clock from a clock generator upon receiving the parallel data input. Continuing with some example embodiments, the full serializer may be configured to divide the half rate clock. In some example embodiments, the half rate clock may be divided based on at least one requirement related to the full serializer. Moving forward, the full serializer may be configured to serialize the parallel data input stage by stage. In some example embodiments, the parallel data input may be serialized till a quarter rate level for the parallel data input is reached.

In continuation with some example embodiments, the full serializer may be configured to generate a pre-cursor, a main cursor, and a post cursor. In some example embodiments, the pre-cursor, the main cursor, and the post cursor may be generated by minimizing or reducing a first latch and a second latch. Continuing with the above embodiment, the full serializer may be configured to perform a final serialization of the pre-cursor, the main cursor, and the post cursor by the three 4 to 1 serializers functioning as the quarter rate serializer 302.

Figure 7B:
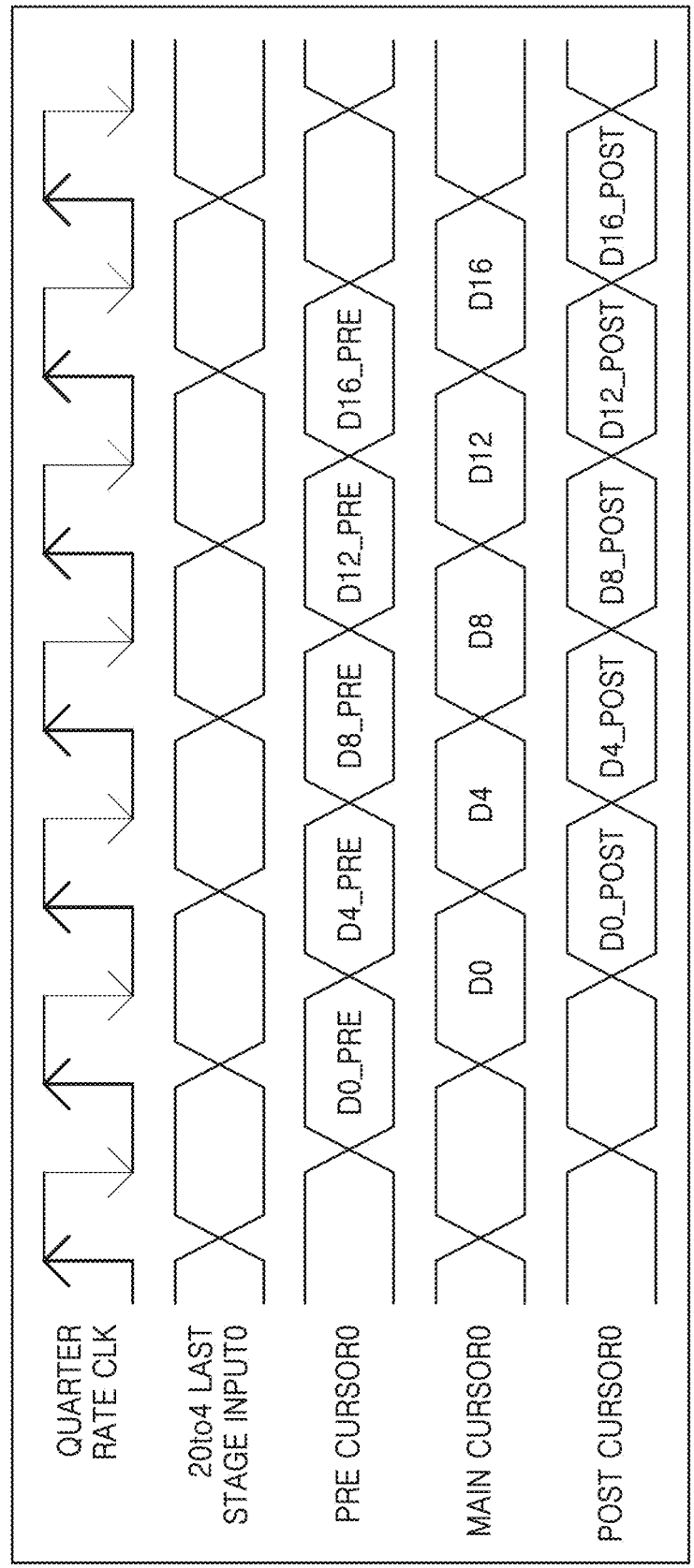
FIG. 7B illustrates a graphical representation of waveforms related to an 80-bit quarter rate serializer, in accordance with some example embodiments of inventive concepts.

FIG. 7B illustrates a graphical representation 800b of waveforms related to the full serializer, in accordance with some example embodiments of inventive concepts.

Figure 8:
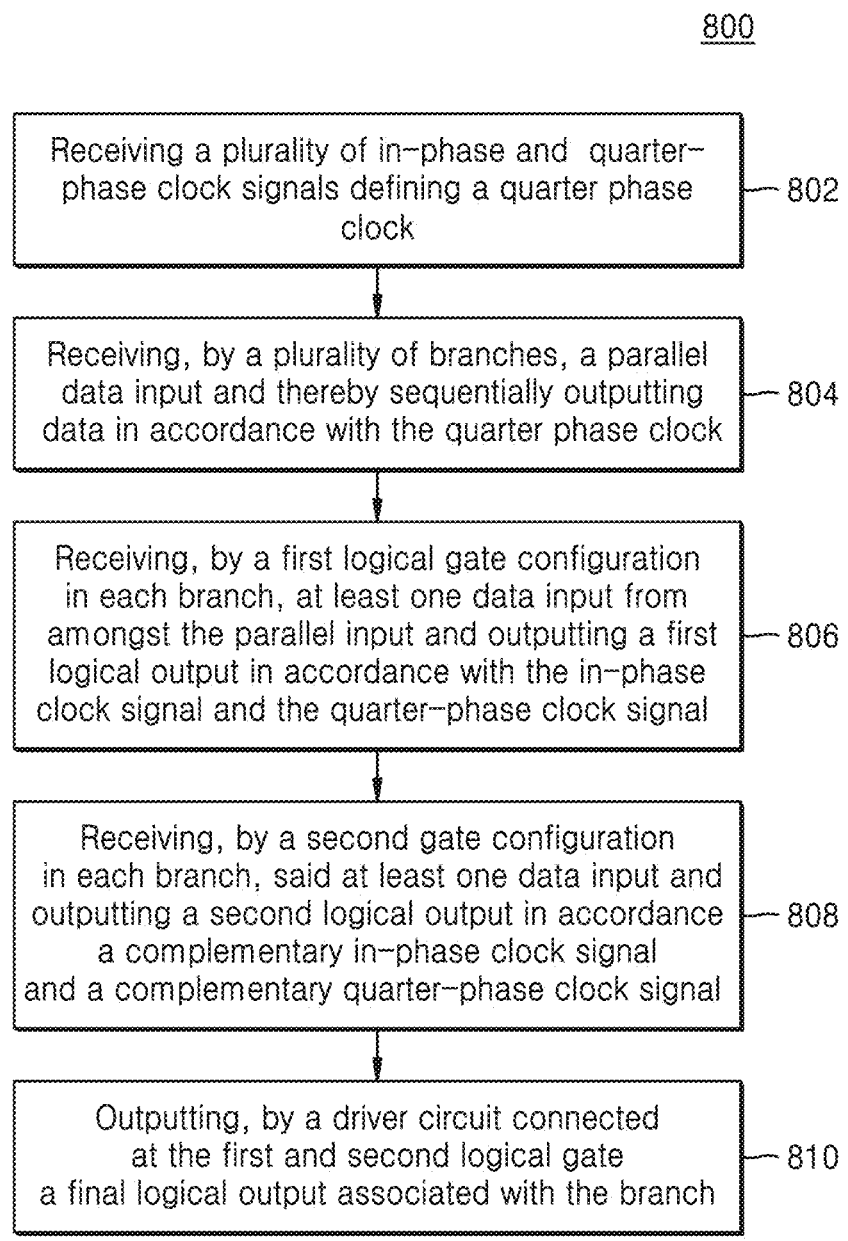
FIG. 8 illustrates a method implemented in a serializer for quarter rate serialization, according to some example embodiments of inventive concepts.

FIG. 8 illustrates a method 800 implemented in an implemented in a serializer for quarter rate serialization, according to some example embodiments of inventive concepts. In an example, the method 800 may be implemented by a full serializer as referred in the FIG. 7, using components thereof, as described above. Further, for the sake of brevity, details of the present disclosure that are explained in details in the description of FIG. 1 to FIG. 7 are not explained in detail in the description of FIG. 8.

At block 802, the method 800 includes receiving a plurality of in-phase and quarter-phase clock signals defining a quarter phase clock.

At block 804, the method 800 includes, receiving, by a plurality of branches, a parallel data input and thereby sequentially outputting data in accordance with the quarter phase clock.

At block 806, the method 800 includes each of the branches comprising a first logical gate configuration for receiving at least one data input from amongst the parallel data input and outputting a first logical output in accordance with the in-phase clock signal and the quarter-phase clock signal.

At block 808, the method 800 includes a second logical gate configuration for receiving said at least one data input and outputting a second logical output in accordance a complementary in-phase clock signal and a complementary quarter-phase clock signal.

At block 810, the method 800 includes, a driver circuit connected at the output of the first and second logical gate to output a final logical output associated with the branch.

As used herein, at least some of the elements described herein may be implemented in processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

While specific language has been used to describe some example embodiments, any limitations arising on account thereto, are not intended. As would be apparent to a person of ordinary skill in the art, various working modifications may be made to the method to implement inventive concepts as taught herein. The drawings and the foregoing description give some examples of various embodiments. Those of ordinary skill in the art will appreciate that one or more of the described elements may well be combined into a single functional element. Alternatively, certain elements may be split into multiple functional elements. Example embodiments are not necessarily mutually exclusive with one another. One or more elements from one or more example embodiment may be added to, or removed from other example embodiments.

We claim:

1. A serializer based on quarter rate architecture for a transmitter comprising:
   a port configured to receive a quarter rate data input;
   a quarter-phase clock generator configured to generate an in-phase clock signal, a complementary in-phase clock signal, and quarter-phase clock signal, and a complementary quarter-phase clock signal; and
   a plurality of branches each including at least one NAND gate and at least one NOR gate and configured to receive the quarter rate data input, and to sequentially output data based on a clock signal generated by the quarter-phase clock generator, each of the plurality of branches including,
      a first logical gate configured to receive at least one data input among the quarter rate data input, one of the in-phase clock signal or the complementary in-phase clock signal, and one of the quarter-phase clock signal or the complementary quarter-phase clock signal, the first logical gate being further configured to output a first logical output based on the received at least one data input, the one of the in-phase clock signal or the complementary in-phase clock signal, and the one of the quarter-phase clock signal or the complementary quarter-phase clock signal a second logical gate configured to receive the at least one data input, the another one of the received in-phase clock signal or the complementary in-phase clock signal, and the another one of the received quarter-phase clock signal or the complementary quarter-phase clock signal, the second logical gate being further configured to output a second logical output based on the at least one data input, the another one of the received in-phase clock signal or the complementary in-phase clock signal, and the another one of the received quarter-phase clock signal or the complementary quarter-phase clock signal, and driver circuitry connected to an output of the first logical gate and an output of the second logical gate, the driver circuitry configured to output a final logical output, the final logical output associated with each branch of the plurality of branches.

2. The serializer of claim 1, wherein the quarter rate data input is defined by at least one of:
a main data input;
a precursor data input; or
a postcursor data input.

3. The serializer of claim 2, wherein the precursor data input corresponds to a first latch output of a final stage flop of a previous serializer stage within the transmitter.

4. The serializer of claim 2, wherein the postcursor data input corresponds to a delayed output of a final stage flop of a previous serializer stage within the transmitter.

5. The serializer of claim 1, wherein the first logical gate corresponds to the at least one NAND gate, and the second logical gate corresponds to the at least one NOR gate.

6. The serializer as claimed in claim 5, wherein the data input, the in-phase clock signal or the complementary in-phase clock signal, and the quarter-phase clock signal or the complementary quarter-phase clock signal are input to the NAND gate in a first order to obtain serialized output, the first order based on a jitter of the serialized output.

7. The serializer as claimed in claim 5, wherein the data input, the in-phase clock signal or the complementary in-phase clock signal, and the quarter-phase clock signal or the complementary quarter-phase clock signal are input to the at least one NOR gate in a second order to obtain serialized output, the second order based on a jitter of the serialized output.

8. The serializer as claimed in claim 1, wherein each of the first logical gate and the second logical gate include at least one PMOS switch and at least one NMOS switch.

9. The serializer as claimed in claim 1, wherein the driver circuitry corresponds to a CMOS inverter based push-pull configuration, and is configured to generate a rail voltage as a final output.

10. A serializer based on quarter rate architecture for a transmitter comprising:
a port configured to receive a quarter rate data input;
a quarter-phase clock generator configured to generate an in-phase clock signal, a complementary in-phase clock signal, and quarter-phase clock signal, and a complementary quarter-phase clock signal; and a plurality of branches configured to receive the quarter rate data input, and to sequentially output data based on a clock signal generated by the quarter-phase clock generator, each of the plurality of branches including,
a first logical gate configured to receive at least one data input among the quarter rate data input and to output a first logical output based on (A) one of the in-phase clock signal or the complementary in-phase clock signal and on (B) one of the quarter-phase clock signal or the complementary quarter-phase clock signal,
a second logical gate configured to receive the at least one data input and to output a second logical output based on (C) the other of the in-phase clock signal or the complementary in-phase clock signal and on (D) the other of the quarter-phase clock signal or the complementary quarter-phase clock signal, and
driver circuitry connected to an output of the first logical gate and an output of the second logical gate, the driver circuitry configured to output a final logical output, the final logical output associated with each branch of the plurality of branches,
wherein the main data input corresponds to a second latch output of a final stage flop of a previous serializer stage within the transmitter.

11. A method, implemented in a serializer for quarter rate serialization, comprising:
receiving a plurality of clock signals including an in-phase clock signal, a complementary in-phase clock signal, a quarter-phase clock signal and a complementary quarter-phase clock signals, the plurality of clock signals defining a quarter-phase clock;
receiving, at one of a plurality of branches, each including at least one NAND gate and at least one NOR gate, a quarter rate data input;
sequentially outputting data in accordance with the plurality of clock signals;
receiving, by a first logical gate in each branch of the plurality of branches, at least one data input amongst the quarter rate data input, one of the in-phase clock signal or the complementary in-phase clock signal, and one of the quarter-phase clock signal or the complementary quarter phase clock signal;
outputting a first logical output based on the received one of the in-phase clock signal or the complementary in-phase clock signal and on the received one of the quarter-phase clock signal or the complementary quarter-phase clock signal;
receiving, by a second logical gate in each branch, the at least one data input, the another one of the received in-phase clock signal or the complementary in-phase clock signal, and the another one of the received quarter-phase clock signal or the complementary quarter-phase clock signal;
outputting a second logical output based on the another one of the in-phase clock signal or the complementary in-phase clock signal and on the another one of the quarter-phase clock signal or the complementary quarter-phase clock signal; and
outputting, by driver circuitry connected at an output of the first logical gate and the second logical gate a final logical output associated with the one of the plurality of branches.

12. The method of claim 11, wherein the quarter rate data input is defined by at least one of:
a main data input;
a precursor data input; or
a postcursor data input.

13. The method of claim 12, wherein the main data input corresponds to a second latch output of a final stage flop of a previous serializer stage within a transmitter.

14. The method of claim 12, wherein the precursor data input corresponds to a first latch output of a final stage flop of a previous serializer stage within a transmitter.

15. The method of claim 12, wherein the postcursor data input corresponds to a delayed output of a final stage flop of a previous serializer stage within a transmitter.

16. The method of claim 11, wherein the first logical gate corresponds to a NAND gate, and the second logical gates corresponds to a NOR gate.

17. The method of claim 16, wherein the data input, the in-phase clock signal, and the quarter-phase clock signal are input to the NAND gate in a first order to obtain serialized output, the first order based on a jitter of the serialized output.

18. The method as claimed in claim 16, wherein the data input, the in-phase clock signal and the quarter-phase clock signal are input to the NOR gate in a second order to obtain serialized output, the second order based on a jitter of the serialized output.

19. The method of claim 11, wherein the first logical gate is connected to at least one PMOS transistor, and the second logical gate is connected to at least one NMOS transistor.

20. The method of claim 11, wherein the driver circuitry corresponds to a CMOS inverter based push-pull configuration and is configured to generate a rail voltage as a final output.

* * * * *